United States Patent
Chen et al.

(10) Patent No.: US 7,545,194 B2
(45) Date of Patent: Jun. 9, 2009

(54) PROGRAMMABLE DELAY FOR CLOCK PHASE ERROR CORRECTION

(75) Inventors: Suwei Chen, Hillsboro, OR (US); Aaron K. Martin, El Dorado Hills, CA (US); Ying L. Zhou, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 110 days.

(21) Appl. No.: 11/479,520

(22) Filed: Jun. 30, 2006

(65) Prior Publication Data

US 2008/0012653 A1 Jan. 17, 2008

(51) Int. Cl.
*H03H 11/26* (2006.01)
(52) U.S. Cl. .............. 327/276; 327/231; 327/233; 327/563
(58) Field of Classification Search ........... 327/276, 327/103, 231–238, 52, 55, 562, 563
See application file for complete search history.

(56) References Cited

U.S. PATENT DOCUMENTS

| | | | |
|---|---|---|---|
| 4,866,397 A | 9/1989 | Kimyacioglu | |
| 5,469,120 A | 11/1995 | Nguyen et al. | |
| 5,635,878 A * | 6/1997 | Liu et al. | 331/57 |
| 6,252,432 B1 * | 6/2001 | Freitas | 327/65 |
| 6,433,637 B1 * | 8/2002 | Sauer | 330/255 |
| 6,621,317 B2 * | 9/2003 | Saeki | 327/163 |
| 2003/0002607 A1 * | 1/2003 | Mooney et al. | 375/355 |
| 2004/0120437 A1 | 6/2004 | Casper et al. | |
| 2006/0181320 A1 | 8/2006 | Dreps et al. | |

OTHER PUBLICATIONS

Razavi, B., et al.: "Design of Analog CMOS Integrated Circuits," McGraw-Hill, pp. 296, Figure 9.6 (3 pages), ISBN 0-07-238032-2, 2002.
United Kingdom Search Report for Application No. GB0712815.0, dated Oct. 9, 2007, 1 page.

* cited by examiner

*Primary Examiner*—Kenneth B Wells
*Assistant Examiner*—John W Poos
(74) *Attorney, Agent, or Firm*—Derek J. Reynolds

(57) ABSTRACT

A method, circuit, and system are disclosed. In one embodiment, the method comprises receiving a differential clock signal from two clock signal lines into a first differential pair of transistors of a first size, receiving the differential clock signal from the two clock signal lines into a second differential pair of transistors of a size smaller than the first size, converting the differential clock signal into a single-ended clock signal, outputting the single-ended clock signal through an inverter, and synchronizing any differential clock phase error by controlling the transconductance between the first differential pair of transistors and the second differential pair of transistors.

15 Claims, 7 Drawing Sheets

PROGRAMMABLE DELAY FOR CLOCK PHASE ERROR CORRECTION

FIELD OF THE INVENTION

The invention relates to clock buffers. More specifically, the invention relates to clock phase error correction within clock buffers.

BACKGROUND OF THE INVENTION

Multi-phase clocking is a competitive choice among clocking schemes for high-speed data links. It uses multiple phases of a low frequency clock that usually runs at a fraction of the full speed, which is the frequency of the data rate, to drive the input and output circuitries. As a compromise between speed and power consumption, multi-phase clocking helps achieve data rates in the gigabits range without stretching the frequency limits of clocking circuitries.

Unfortunately, multi-phase clocking has some unique problems. One example is clock phase error, which is defined as the difference in propagation delay between two phases accumulated through supposedly matched clock paths. Clock phase error is mainly caused by device and parasitic mismatch. There are wafer-to-wafer device mismatches and lot-to-lot device mismatches, but in general, two devices, even if manufactured to strict specifications, will never match perfectly because of the inherent error range attached to any manufacturing process. Parasitic mismatch, on the other hand, refers to the inherent capacitance associated with all devices and transmission lines. Both device mismatch and parasitic mismatch is relevant within any clocking scheme.

It is possible to correct clock phase error by adding an adjustable delay to the clock path. FIG. 1 shows a non-programmable differential-to-single-ended (D2SE) clock buffer that often is located at the end of a differential clock distribution path. The D2SE clock buffer converts a differential clock, such as a current-mode logic (CML) clock, to a full-rail clock that input/output (I/O) circuitries require.

FIG. 1 illustrates one embodiment of a standard non-programmable D2SE clock buffer. In FIG. 1, the pair of differential clock transmission lines enter the clock buffer circuit as inn (100) and inp (102). Each differential clock transmission line is coupled to the gate of an NMOS transistor, inn (100) is coupled to the gate of transistor 104 and inp (102) is coupled to the gate of transistor 106. In this embodiment of a standard D2SE clock buffer, two additional PMOS transistors (108 and 110) are present in the circuit. The layout of this clock buffer circuit allows the single-ended transmission line that begins at node outn1 (116) to alternately charge from a positive supply voltage (Vdd) when inn (100) is high and drain to a current drain Iss (112) when inp (102) is high. As soon as outn1 (116) has charged or drained enough, the inverter 114 will flip and send out the opposite signal on the single-ended clock transmission line (outp).

In this embodiment, it is assumed that the differential clock signal entering the D2SE clock buffer circuit from the inn (100) and inp (102) transmission lines has no clock-phase error and thus is aligned. As the signals make their way through the clock buffer circuit and eventually leave the circuit on outp they are potentially affected by any device and parasitic mismatch capacitances inherent to the circuit. Additionally, the clock buffer circuit is compensating for any error accumulated through the whole clock path. Thus, there may be a clock phase error when the differential clock converts to a single-ended clock at node outn1 (116). More specifically, the potential device mismatch of the capacitances for transistor 104 and transistor 106 may create a clock phase error. Also, the parasitic capacitance naturally within transistors 106 and 110 as well as within inverter 114 will create additional clock phase error at node outn1 (116).

FIG. 2 illustrates one embodiment of a limited solution added to the D2SE clock buffer to eliminate the device and parasitic mismatch capacitances inherent to the clock buffer in FIG. 1. In FIG. 2, the entire D2SE clock buffer from the pair of differential clock transmission lines, which enter the clock buffer circuit as inn (200) and inp (202), to the node outn1 (212) is identical. Then at the node outn1 (212), where the differential clock signal converted to the single-ended clock signal through the charge and discharge functionality as described in FIG. 1, one or more capacitors are added to the single-ended clock transmission line (shown in bubble 214). To create a more manageable and modifiable environment, in one embodiment the capacitors are programmable. When drain and source voltages change between the voltage supply (Vdd) and the ground (Vss), the depletion layer in the capacitors within 214 are affected and, subsequently, their gate capacitance. Thus, in this embodiment, it is possible to increase or decrease the capacitance of each of the one or more added capacitors to adjust to affected gate capacitance as necessary.

Though, there is an inherent problem with the solution in FIG. 2 because the non-programmable portion of the capacitors' gate capacitance is significant, which becomes overhead capacitance. The overhead requires extra power to drive this extra capacitive loading to compensate.

BRIEF DESCRIPTION OF THE DRAWINGS

The present invention is illustrated by way of example and is not limited by the figures of the accompanying drawings, in which like references indicate similar elements, and in which.

DETAILED DESCRIPTION OF THE INVENTION

Embodiments of a method, circuit, and system for a programmable delay for clock phase error correction are disclosed. In the following description, numerous specific details are set forth. However, it is understood that embodiments may be practiced without these specific details. In other instances, well-known elements, specifications, and protocols have not been discussed in detail in order to avoid obscuring the present invention.

Figure 1:
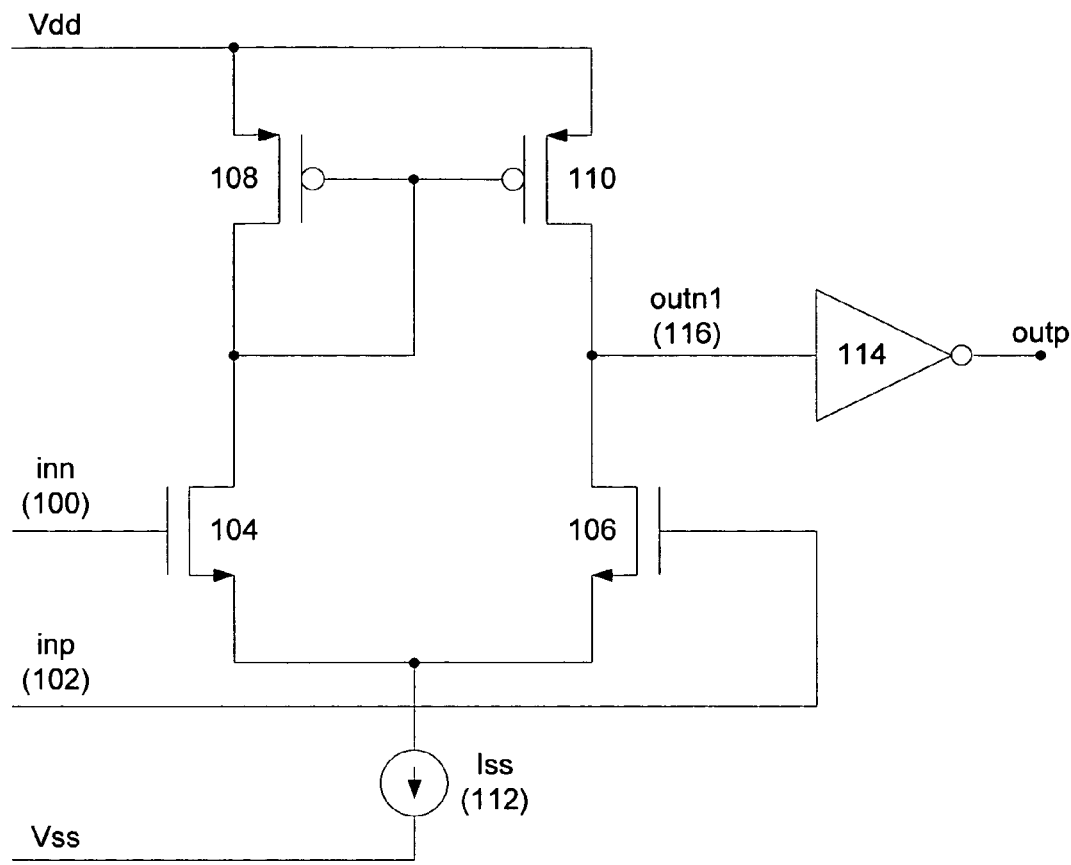
FIG. 1 illustrates one embodiment of a standard non-programmable D2SE clock buffer.
Figure 2:
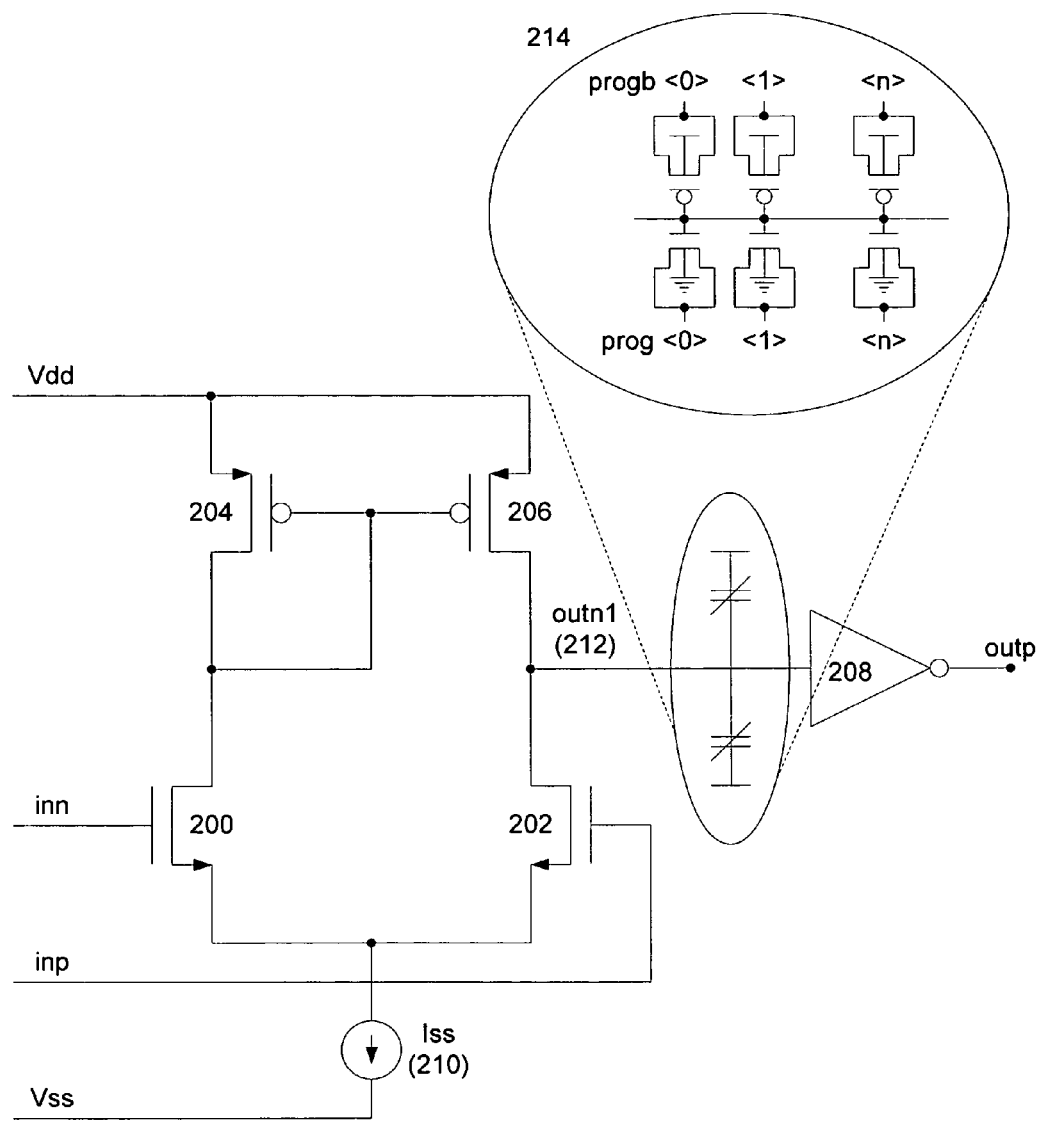
FIG. 2 illustrates one embodiment of a limited solution added to the D2SE clock buffer to eliminate the device and parasitic mismatch capacitances inherent to the clock buffer in FIG. 1.
Figure 3:
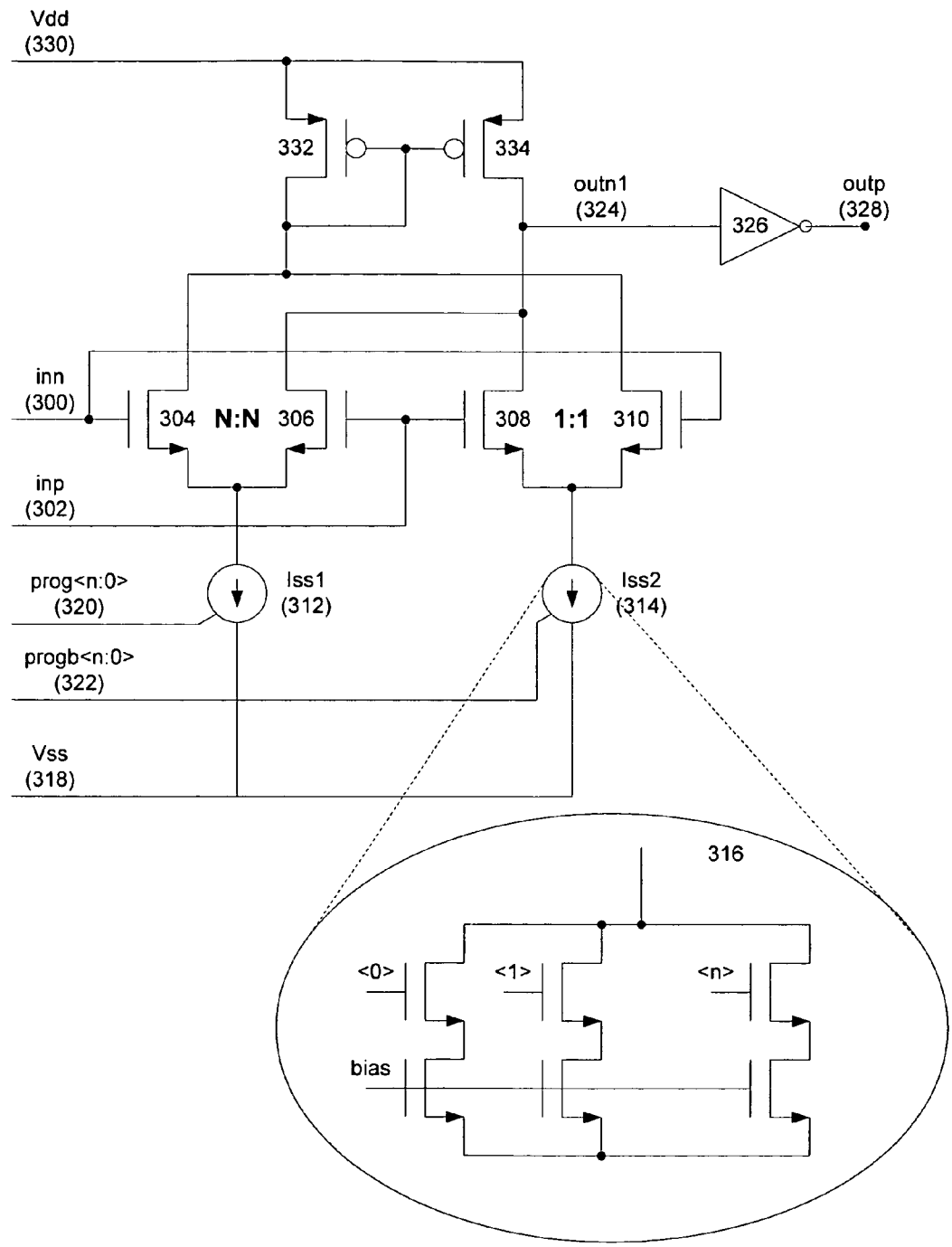
FIG. 3 is a diagram of one embodiment of a D2SE clock buffer with a programmable delay.

FIG. 3 is a diagram of one embodiment of a D2SE clock buffer with a programmable delay. The clock buffer circuit in FIG. 3 receives a pair of differential clock transmission lines, inn 300 and inp 302. Each differential clock transmission line is coupled to the gates of two separate NMOS transistors, inn (300) is coupled to the gates of transistors 304 and 310 and inp (302) is coupled to the gates of transistors 306 and 308.

These four transistors form two separate differential pairs, differential pair 304/306 and differential pair 308/310. The source of the two transistors in differential pair 304/306 are coupled to a common current source, bias current Iss1 312, whereas the source of the two transistors in differential pair 308/310 are coupled to a separate common current source, bias current Iss2 314. Both Iss1 312 and Iss2 314 are coupled to a common ground, Vss 318.

Iss1 312 and Iss2 314 are programmable current sources (they may also be referred to as current drains). There are different technologies that may make up the current source. In one embodiment, each of the two current sources, Iss1 312 and Iss2 314 are comprised of circuitry shown in bubble 316. Additionally, Iss1 312 and Iss2 314 are programmable, thus there are one or more programming lines entering each current source to allow for programming. In this embodiment, Iss1 312 is programmed by the prog<n:0> lines 320 and Iss2 314 is programmed by the progb<n:0> lines 322. Programming the prog<n:0> lines 320 and the progb<n:0> lines 322 turn on or off certain transistor pairs within the current source module (as shown in bubble 316), which in turn will increase or decrease the allowable current through the current source.

In one embodiment, the two transistors in differential pair 308/310 are the same size. In different embodiments, the size of a transistor may include the width of the transistor, the length of the transistor, or the width and length of the transistor. In the embodiment as shown in FIG. 3, transistor size refers to the width of the transistor, assuming a common length for all four transistors in the two differential pairs. Thus, FIG. 3 shows that the size of the transistors in differential pair 308/310 has been normalized to "1". In this embodiment, the two transistors in differential pair 304/306 are the same size. In this embodiment, the size of each of the two transistors in differential pair 304/306 is "N" times the size of each of the two transistors in differential pair 308/310. In one embodiment, the range of N is between 2 and 4. In another embodiment, the range of N is a size of any real positive number. Thus, in another embodiment, "N" may be a positive number less than one, which means that each individual transistor in differential pair 304/306 is smaller in size than each individual transistor in differential pair 308/310.

In the embodiment illustrated in FIG. 3 where N is between 2 and 4, the total bias current is split between two current sources (Iss1+Iss2). The programmable inputs (prog<n:0> and progb<n:0>) control the bias current ratio between the two differential pairs. The transconductance from the inputs (inp 300 and inn 302) through the differential pairs (304/306 and 308/310), which determines the delay through the entire D2SE clock buffer, is defined as:

$$g_m = \sqrt{const*(W/L)*Ids}$$

where $g_m$=Transconductance, W=width of the transistor, L=length of the transistor, const=a constant, and Ids=source-drain current. Thus, in this embodiment where the L is the same for any transistor and const is inherently the same, the width of the transistor and the current flowing through the transistor are the two variables that can modify the transconductance of a transistor.

The width of the transistor is not modifiable after the clock buffer circuit is manufactured, so the only way to dynamically change the transconductance while in operation is to modify the current. The current flowing through the clock buffer cannot change greatly because the clock buffer circuit requires a minimum current to function correctly and there is a maximum current limit for any circuit as well. Thus, in one embodiment, the width of transistors in the first differential pair 304/306 and the width of the transistors in the second differential pair 308/310 are both established to set the transconductance at a predetermined level when the current (i) is in the middle of a normal and operable current range. The two differential pairs of transistors allows for a larger modifiable transconductance range than a single differential pair circuit. The current may be programmed for Iss1 312 and Iss2 314 separately, thus allowing for a change in the transconductance ratio between the two differential pairs.

The D2SE clock buffer in FIG. 3 has two additional PMOS transistors (332 and 334) present in the circuit. The layout of this clock buffer circuit allows the parasitic capacitance at node outn1 (324) to alternately charge from a positive supply voltage Vdd 330 when inn 300 is high and drain to the split current drains Iss1 312 and Iss2 314 when inp 302 is high. As soon as node outn1 324 has charged or drained enough, the inverter 326 will flip and send out the respective falling or rising edge of the single-ended clock signal on the single-ended clock transmission line outp 328.

As the signals make their way through the clock buffer circuit and eventually leave the circuit on outp they are potentially affected by any device and parasitic mismatch capacitances inherent to the circuit as well as any error accumulated through the entire clock path. Thus, there may be a clock phase error when the differential clock converts to a single-ended clock at node outn1 324. More specifically, the potential device mismatch of the capacitances for the first differential pair 304/306 and the capacitances of the second differential pair 308/310 may create a clock phase error. Also, the parasitic capacitance naturally within transistors 306, 308, and 334 as well as within inverter 326 will create additional clock phase error at node outn1 324.

Figure 4:
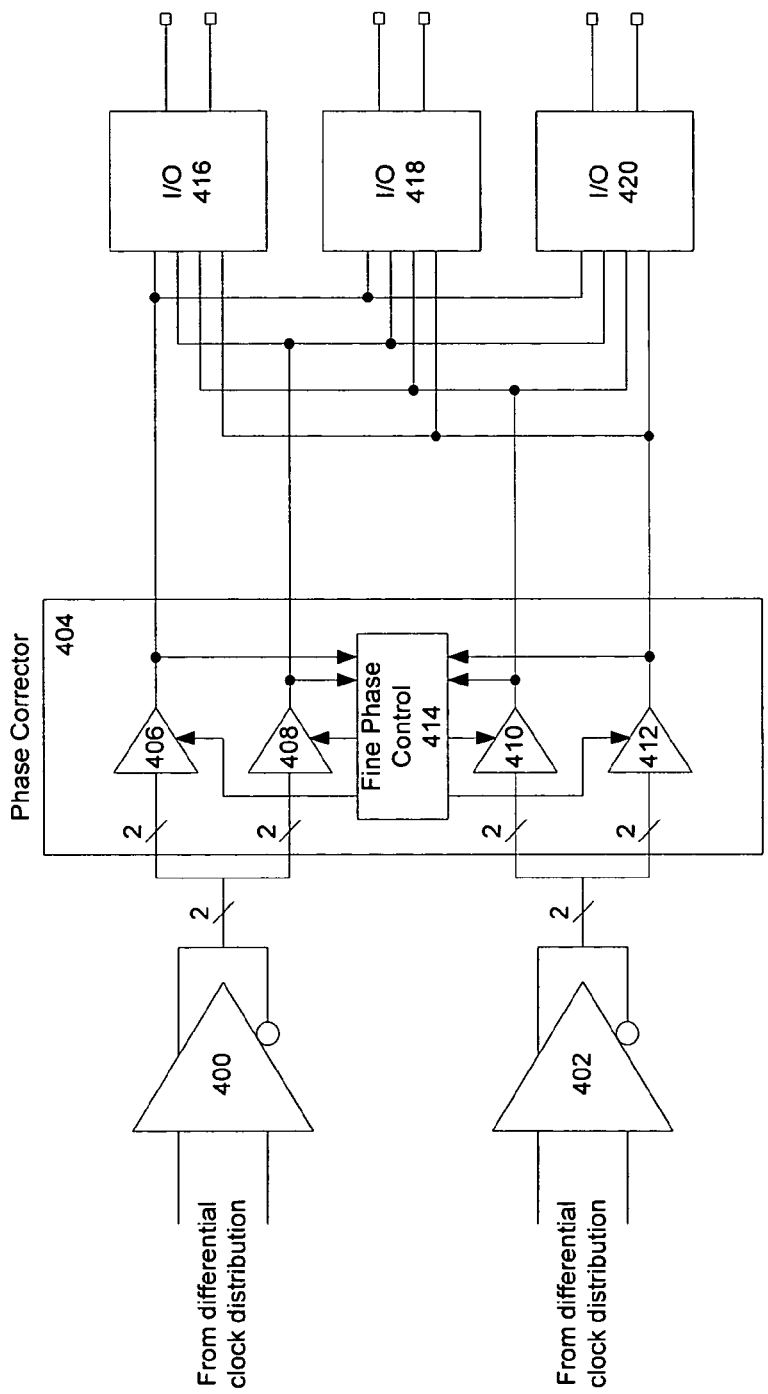
FIG. 4 illustrates a clock distribution system that utilizes one or more of the programmable D2SE clock buffers described in FIG. 3.

FIG. 4 illustrates a clock distribution system that utilizes one or more of the programmable D2SE clock buffers described in FIG. 3. Differential clock transmitters 400 and 402 send clock signals in a quadrature-phase clocking scheme across differential clock transmission lines. A quadrature-phase clocking scheme requires clock signals to be distributed in four phases of 0°, 90°, 180°, and 270°. Each quadrature phase clock signal passes through a phase corrector unit 404, which includes 4 programmable D2SE clock buffers (406, 408, 410, 412), as described in FIG. 3, and a fine phase control unit 414.

The fine phase control unit 414 receives as input all four signals associated with each phase of the quadrature clock signal from the programmable D2SE clock buffers (406, 408, 410, 412). Once it has received the four signal phases, the fine phase control unit 414 sends necessary control information to each of the programmable D2SE clock buffers. The clock buffers receive the information and each modify their internal Iss1 and Iss2 currents (as detailed in FIG. 3) to increase or decrease the transconductance, which increases or decreases the delay of the clock signal through each respective clock buffer to correct any phase error. Then the clock buffers send out the phase-corrected quadrature signals to I/O circuitry (416, 418, 420). In one embodiment, the fine phase control unit periodically updates the control inputs of the D2SE clock buffer to correct any clock phase error between the I-clock (0° and 180° phases) and the Q-clock (90° and 270° phases).

Figure 5:
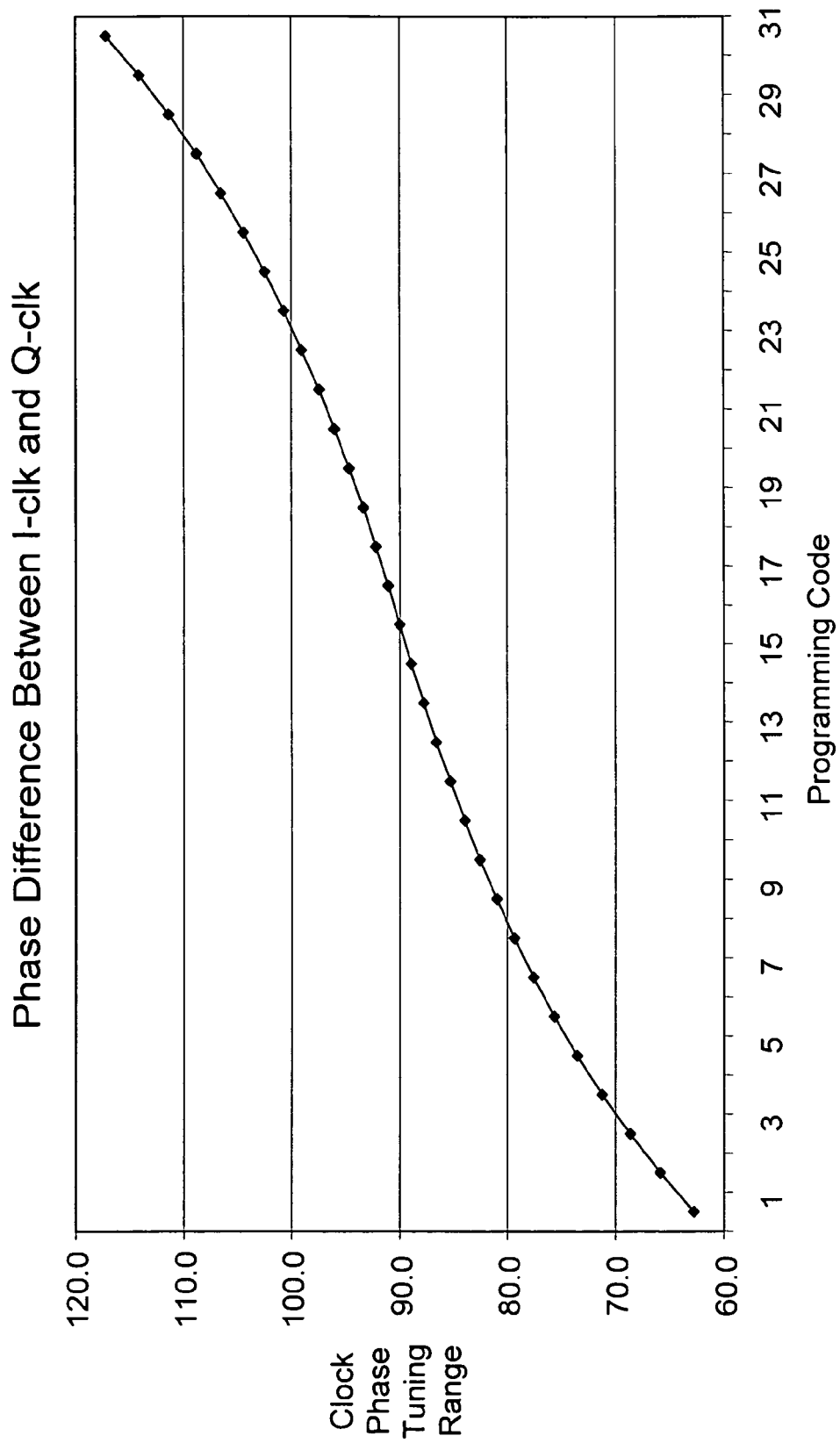
FIG. 5 illustrates the tuning range of quadrature phase correction using one embodiment of the D2SE clock buffer described in FIG. 3.

FIG. 5 illustrates the tuning range of quadrature phase correction using one embodiment of the D2SE clock buffer described in FIG. 3. In one embodiment, the programming code that increases or decreases the delay within the programmable D2SE clock buffer is 5-bits wide and thus is able to adjust to 32 separate current settings within the current sources Iss1 and Iss2. The programming code is separate for each current source, thus the 32 settings are individual per current source. In FIG. 5, the current flow through a current source increases as the programmable setting number increases. FIG. 5 shows the phase delay normalized at 90°, which is a synchronized delay for a quadrature phase in relationship to the previous phase. The 90° phase delay would require a current source programming code setting of 16. If the setting were decreased, the phase delay would shift to below 90°, whereas if the setting were increased, the phase delay would shift to above 90°.

Figure 6:
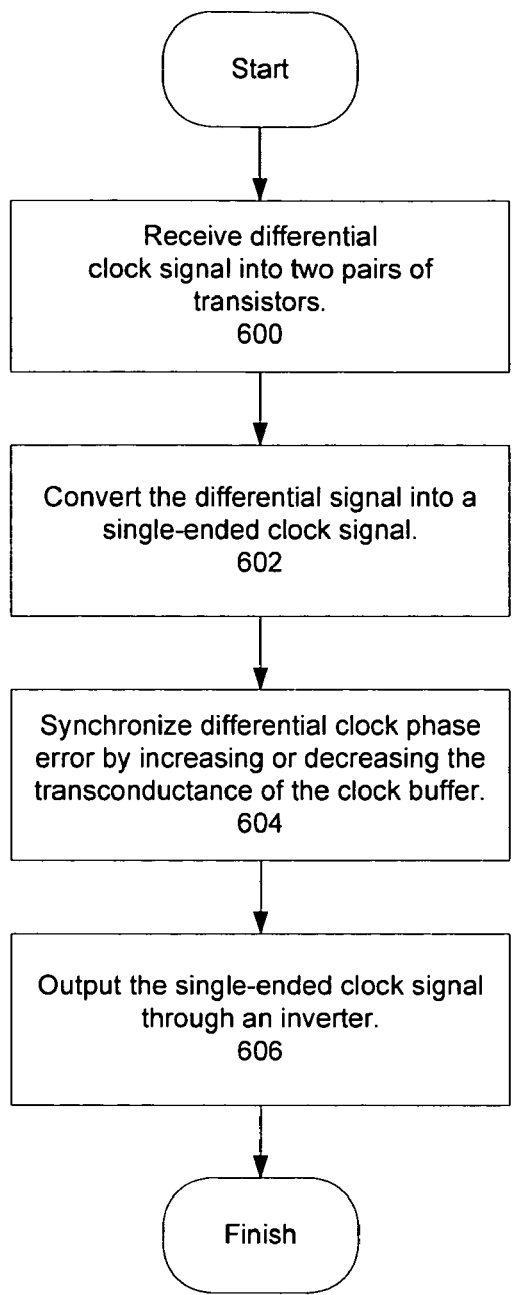
FIG. 6 is a flow diagram illustrating one embodiment of a process to synchronize a differential clock phase error.

FIG. 6 is a flow diagram illustrating one embodiment of a process to synchronize a differential clock phase error. The process is performed by processing logic that may comprise hardware (circuitry, dedicated logic, etc.), software (such as is run on a general purpose computer system or a dedicated machine), or a combination of both. Referring to FIG. 6, the process begins by processing logic receiving a differential clock signal into two pairs of transistors (processing block 600). In one embodiment, the two pairs of transistors that receive the differential clock signal are two differential pairs of transistors where the two transistors that make up a pair are of equal size, but one transistor pair is smaller in size than the other transistor pair. In one embodiment, the differential signal received by processing logic is a 4-phased quadrature differential clock signals.

Next, the process continues by processing logic converting the differential signal into a single-ended clock signal (processing block 602). In one embodiment, the conversion process requires a D2SE clock buffer that may have device and parasitic mismatch capacitance inherent in the circuit. In this embodiment, if there is device or parasitic mismatch the resulting single-ended converted clock signal may have a clock phase error resulting from the conversion process. The mismatch of the whole clock distribution paths will also contribute to overall clock phase error.

Then the process continues by processing logic synchronizing the differential clock phase error by increasing or decreasing the transconductance of the clock buffer (processing block 604). The transconductance of the clock buffer circuit is discussed in greater detail in reference to FIG. 3 above. The greater the transconductance of the circuit, the smaller the delay of the signal. Thus, the transconductance of the clock buffer circuit is increased or decreased accordingly to allow for the delay between two subsequent clock phases to decrease or increase.

Finally, the process concludes by processing logic outputting the single-ended clock signal through an inverter (processing block 606). In one embodiment, the inverter is placed at the node in the clock buffer circuit that receives the converted signal. As a result of the processing logic synchronizing any clock phase error, the single-ended clock signal is phase-aligned as it leaves the clock buffer circuit.

Figure 7:
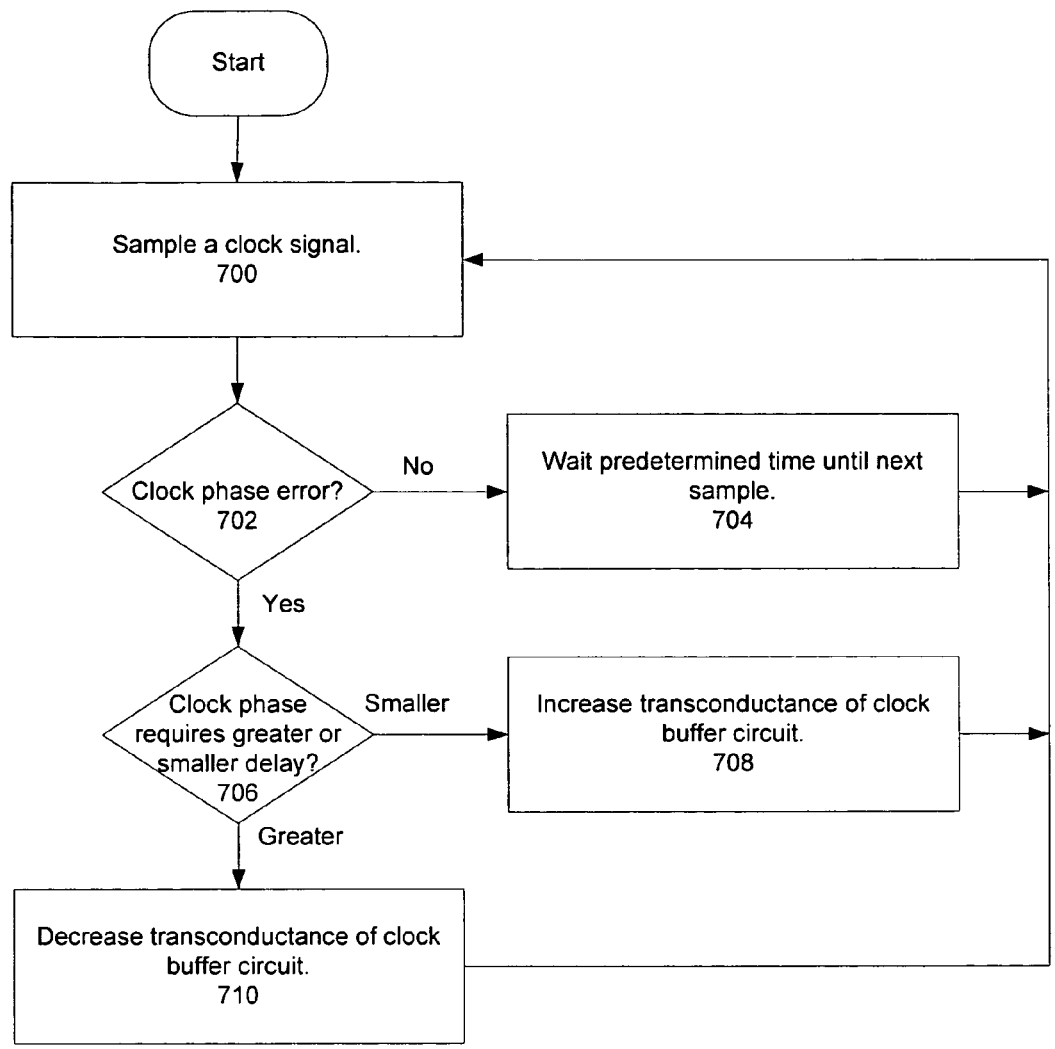
FIG. 7 is a flow diagram of one embodiment of a process to dynamically correct the clock phase error over time during operation of the D2SE clock buffer.

While FIG. 6 shows a single conversion and clock phase error correction process. FIG. 7 is a flow diagram of one embodiment of a process to dynamically correct the clock phase error over time during operation of the D2SE clock buffer. The process is performed by processing logic that may comprise hardware (circuitry, dedicated logic, etc.), software (such as is run on a general purpose computer system or a dedicated machine), or a combination of both. Referring to FIG. 7, the process begins by processing logic sampling a clock signal (processing block 700). In one embodiment, the clock signal is a single-ended clock signal that is sampled immediately after it has been output from a D2SE clock buffer where it has been converted from a differential clock signal. In one embodiment, the differential clock signal that is converted is a quadrature-phased clock signal.

Next, processing logic determines whether there is a clock phase error (processing block 702). In one embodiment, the processing logic measures the phase error by determining if several consecutive rising and falling edges of the single-ended clock signal are equidistant in time from each other. If a predetermined consecutive number of edges are equidistant in time, then there is no clock phase error. Otherwise, if there are time discrepancies between the edges, then it is determined that a clock phase error is present. In many other embodiments there are other previously developed ways to determine whether a clock phase error exists.

If there is no clock phase error, then processing logic waits a predetermined time until the next sample (processing block 704). In different embodiments, the time delay between samples can be any time from the frequency of each quarter phase of the quadrature signal (one sample per clock edge, thus no noticeable delay) up to any usable periodic delay above that frequency (e.g. 1 µs, 1 ms, etc.).

If there is a clock phase error, then processing logic determines whether two or more clock phases are too close together in time and require greater delay or two or more clock phases are too far apart in time and require a smaller delay (processing block 706). If a smaller delay is required, then processing logic increases the transconductance of the D2SE clock buffer circuit (processing block 708). In one embodiment, transconductance is increased by increasing the current flowing one or more current sources located in the clock buffer circuit coupled to one or more differential pairs of transistors (e.g. such as those current sources and differential pairs as described in detail in FIG. 3). In one embodiment, the one or more currents increase by a predetermined amount and then the clock signal is sampled again to see whether the clock phase error has been corrected, such as a step function increase.

In this embodiment the current increases one or more times consecutively until the current level through the clock buffer circuit differential pair(s) has reached a level to create a transconductance that will decrease the delay necessary to correct the phase error. In another embodiment, processing logic has access to a table of transconductance amounts and their current flow and time delay amount equivalents. Thus, in this embodiment, the transconductance, and thus current, is increased by an amount necessary in the table to decrease the delay to remedy the clock phase error in a single step.

As described in detail above in reference to FIG. 3, the increase in current may be limited to one current source or split between multiple current sources that are coupled to the differential pairs of transistors within the clock buffer circuit. In different embodiments, when the current is split between more than one current source coupled to more than one differential pair, the increase may be uniform across the current sources or the current increase may be distributed unequally among the multiple current sources as determined by processing logic.

If a greater delay is required, then processing logic decreases the transconductance of the D2SE clock buffer circuit (processing block 710). In one embodiment, transconductance is decreased by decreasing the current flowing one or more current sources located in the clock buffer circuit coupled to one or more differential pairs of transistors (e.g. such as those current sources and differential pairs as described in detail in FIG. 3). In one embodiment, the one or more currents decrease by a predetermined amount and then the clock signal is sampled again to see whether the clock phase error has been corrected, such as a step function decrease.

In this embodiment the current decreases one or more times consecutively until the current level through the clock buffer circuit differential pair(s) has reached a level to create a transconductance that will increase the delay necessary to correct the phase error. In another embodiment, processing logic has access to a table of transconductance amounts and their current flow and time delay amount equivalents. Thus, in this embodiment, the transconductance, and thus current, is decreased by an amount necessary in the table to increase the delay to remedy the clock phase error in a single step.

As described in detail above in reference to FIG. 3, the decrease in current may be limited to one current source or split between multiple current sources that are coupled to the differential pairs of transistors within the clock buffer circuit. In different embodiments, when the current is split between more than one current source coupled to more than one differential pair, the decrease may be uniform across the current sources or the current decrease may be distributed unequally among the multiple current sources as determined by processing logic.

After processing logic increases the transconductance (processing block 708) or decreases the transconductance (processing block 710) the process repeats by processing logic once again sampling the clock signal (processing logic 700).

Thus, embodiments of a method, circuit, and system for a programmable delay for clock phase error correction have been disclosed. These embodiments have been described with reference to specific exemplary embodiments thereof. It will be evident to persons having the benefit of this disclosure that various modifications and changes may be made to these embodiments without departing from the broader spirit and scope of the embodiments described herein. The specification and drawings are, accordingly, to be regarded in an illustrative rather than a restrictive sense.

What is claimed is:

1. A method, comprising:
   receiving a differential clock signal from two clock signal lines into a first differential pair of transistors of a first size;
   receiving the differential clock signal from the two clock signal lines into a second differential pair of transistors of a size smaller than the first size;
   converting the differential clock signal into a single-ended clock signal;
   synchronizing any differential clock phase error by controlling the transconductance between the first differential pair of transistors and the second differential pair of transistors; and
   outputting the single-ended clock signal through an inverter.

2. The method of claim 1, wherein controlling the transconductance between the first differential pair of transistors and the second differential pair of transistors comprises controlling the ratio of the current flowing through the first differential pair of transistors versus the current flowing through the second differential pair of transistors.

3. The method of claim 1, further comprising:
   dynamically monitoring the differential clock phase error; and
   increasing or decreasing the current flow through either the first differential pair of transistors, the second differential pair of transistors, or the first and second differential pairs of transistors in response to the amount of clock phase error present.

4. The method of claim 3, wherein increasing or decreasing the current flow further comprises programming a first programmable current source coupled to the first differential pair of transistors and a second programmable current source coupled to the second differential pair of transistors.

5. The method of claim 1, wherein the second differential pair of transistors is 2 times smaller in size than the first differential pair of transistors.

6. The method of claim 1, wherein the second differential pair of transistors is 4 times smaller in size than the first differential pair of transistors.

7. A clock buffer circuit, comprising:
   a first differential pair of transistors of equal size to receive a differential clock signal pair, to convert the differential clock signal pair to a single-ended clock signal, and to output the single-ended clock signal;
   a first programmable current source, coupled to the first pair of transistors, to vary the current flow through the first pair of transistors; and
   a phase corrector circuit to
      measure the clock phase error on the output single-ended clock signal; and
      synchronize any measured clock phase error by controlling the transconductance between the first differential pair of transistors and the second differential pair of transistors.

8. The clock buffer circuit of claim 7, further comprising:
   a second differential pair of transistors of equal size to receive the differential clock signal pair, to convert the differential clock signal pair to the single-ended clock signal, and to output the single-ended clock signal, wherein the size of the transistors in the second differential pair is smaller than the size of the transistors in the first differential pair; and
   a second programmable current source, coupled to the second pair of transistors, to vary the current flow through the second pair of transistors.

9. The clock buffer circuit of claim 8, further comprising an inverter to receive the single-ended clock signal from the first and second differential pairs of transistors, to invert the single-ended clock signal, and to output the inverted single-ended clock signal.

10. The clock buffer circuit of claim 9, wherein the first programmable current source is additionally coupled to one or more programmable input lines to program the amount of current allowed to flow through the first programmable current source and the second programmable current source is additionally coupled to one or more programmable lines to program the amount of current allowed to flow through the second programmable current source.

11. The clock buffer circuit of claim 10, wherein the current flowing through the first differential pair of transistors, the current flowing through the second differential pair of transistors, or the current flowing through both the first and second differential pairs of transistors is increased or decreased by data sent to the programmable input lines to add an adjustable delay to the differential clock signal pair to compensate for any clock phase error and the inverter comprising a portion of the clock buffer circuit.

12. The clock buffer circuit of claim 8, wherein the difference in size of the transistors between the first and second pairs refers to the difference in width of the transistors, wherein all transistors have an equal length.

13. The clock buffer circuit of claim 12, wherein the size of each transistor in the second differential pair of transistors is 2 times small than the size of each transistor in the first differential pair of transistors.

14. The clock buffer circuit of claim 12, wherein the size of each transistor in the second differential pair of transistors is 4 times small than the size of each transistor in the first differential pair of transistors.

15. The clock buffer circuit of claim 8, wherein the differential clock signal pair further comprises a quadrature-phased clock signal that distributes clocks in four phases of 0 degrees, 90 degrees, 180 degrees, and 270 degrees.

* * * * *